United States Patent [19]

Vander Sande et al.

[11] Patent Number: 4,849,033
[45] Date of Patent: Jul. 18, 1989

[54] ANNEALING GROUP III-V COMPOUND DOPED SILICON-GERMANIUM ALLOY FOR IMPROVED THERMO-ELECTRIC CONVERSION EFFICIENCY

[75] Inventors: Jan W. Vander Sande, Upland; Charles Wood, Flintridge; Susan L. Draper, , all of Calif.

[73] Assignee: The United States of America as represented by the Administrator of the National Aeronautics and Space Administration, Washington, D.C.

[21] Appl. No.: 184,234

[22] Filed: Apr. 21, 1988

[51] Int. Cl.$^4$ ............... H01L 21/223; H01L 29/161; H01L 21/205
[52] U.S. Cl. ................. 148/13.1; 148/13; 437/903; 428/641
[58] Field of Search ............ 148/13, 113.1; 428/641; 437/903

[56] References Cited

U.S. PATENT DOCUMENTS

| | | | |
|---|---|---|---|
| 3,935,040 | 1/1976 | Mason | 148/175 |
| 3,984,857 | 10/1976 | Mason | 148/175 |
| 3,985,590 | 10/1976 | Mason | 148/175 |
| 4,120,706 | 10/1978 | Mason | 148/175 |
| 4,159,214 | 6/1979 | Mason | 148/1.5 |
| 4,180,825 | 12/1979 | Mason | 357/16 |
| 4,376,657 | 3/1983 | Nagasawa et al. | 357/91 |
| 4,437,922 | 3/1984 | Bischoff et al. | 156/643 |
| 4,634,474 | 1/1987 | Camlibel et al. | 148/1.5 |

OTHER PUBLICATIONS

B. Abeles, D. S. Beers, G. D. Cody, and J. P. Dismukes, Phys. Rev., 125, 44, (1962).
J. P. Dismukes, L. Ekstrom, E. F. Steigmeier, I. Kudman and D. S. Beers, J. Appl. Phys., 35, 2899, (1964).
R. K. Pisharody and L. P. Garvey, Proc. 13th Intersociety Energy Conversion Engineering Conf., Publisher: IEEE Publishing Service, N.Y., 1978, 1963.
H. R. Meddins and J. E. Parrott, J. Phys. C: Solid St. Phys., 9, 1263, (1976).
N. Savvides and H. J. Goldsmid, J. Phys. C: Solid Phys., 13, 4657, (1980).
D. M. Rowe and V. S. Shukula, J. Appl. Phys., 52 (12), 7421, (1981).
C. Wood, D. Zoltan and G. Stapfer, Rev. Sci. Instrum., 56, 5, (1985).
J. W. Vander Sande, C. Wood, A. Zoltan, and D. Whittenberger to be published in the Proceedings of the 19th International Thermal Conductivity Conference, Cookeville, Tenn., (1985).
V. M. Glazov and V. S. Zemkov, Physiochemical Foundations of Semiconductor Doping, Nauwa, Moscow, (1967).
Wm. Yim and F. D. Rosi, Solid-State Elec., 15, 1121, (1972).
S. V. Airapetiants, Sov. Phys. Tech. Phys., 2, 429, (1972).
J. W. Vander Sande, C. Wood, S. L. Draper, Mat. Res. Soc. Symp. Proc., vol. 97, Materials Research Society, pp. 347-352, (1987).

Primary Examiner—Upendra Roy
Attorney, Agent, or Firm—Thomas H. Jones; John R. Manning; Paul F. McCaul

[57] ABSTRACT

The thermoelectric conversion efficiency of a GaP dope SiGe alloy is improved about 30 percent by annealing the alloy at a temperature above the melting point of the alloy, preferably stepwise from 1200° C. to 1275° C. in air to form large grains having a size over 50 $\mu$m and to form a Ge-Ga-P rich phase and a silicon rich phase containing SiP and $SiO_2$ particles.

10 Claims, 2 Drawing Sheets

ANNEALING GROUP III-V COMPOUND DOPED SILICON-GERMANIUM ALLOY FOR IMPROVED THERMO-ELECTRIC CONVERSION EFFICIENCY

DESCRIPTION

ORIGIN OF THE INVENTION

The invention described herein was made in the performance of work under a NASA contract, and is subject to the provisions of Public Law 96-517 (35 USC 202) in which the Contractor has elected not to retain title.

TECHNICAL FIELD

The present invention relates to thermoelectric devices and, more particularly, this invention relates to silicongermanium alloys doped with GaP use for thermoelectric energy conversion in the temperature range of 300° C. to 1000° C.

BACKGROUND OF THE INVENTION

Thermoelectric devices based on Group IV semiconductor materials, such as silicon-germanium alloys, have been used very successfully in thermoelectric devices for space applications for well over a decade. Most of the early research on "standard" SiGe (doped only with P or B) was done during the mid 1960,'s by Abeles and co-workers [1,2] on zone-leveled samples. They determined the figure of merit Z, of both n- and p-type SiGe alloys. This measures how good a material is for thermoelectric energy conversion and is given by $$Z = \frac{S^2}{\rho \Lambda} = P \quad (1)$$

where S is the Seebeck coefficient, $\rho$ the electrical resistivity, $\Lambda$ the thermal conductivity and $P(S^2/\rho)$ the power factor. For the n-type alloy, they found the best samples to have a Z with a maximum of $0.90 \times 10^{-3} K^{-1}$ at 825° C. The thermal conductivity of these alloys is relatively high (around 40–44 mW/K-cm for n-type zone leveled and hot-pressed standard SiGe) compared to that of other thermoelectric materials. The logical approach to increasing the figure of merit would thus be to raise the power factor, P, or lower the thermal conductivity $\Lambda$. The latter approach was taken by Pisharody and Garvey [3] who added several mole percent of a III-V compound such as gallium phosphide (GaP) to the hot-pressed alloy. They did find a reduction in the thermal conductivity of around 20-30% but the electrical resistivity increased. Annealing of the samples at between 950° and 1000° C. for several hundred hours reduced the electrical resistivity somewhat but it was still higher than that for the standard SiGe. However the figure of merit for some of their samples did appear to be higher than that for standard SiGe. Unfortunately, most of their samples had some (3-7%) porosity and it is not clear if all three S, $\rho$ and $\Lambda$ measurements, which were only measured up to 600° C., were on the same physical sample. Raag [4] observed that annealing around 1200° C. of the GaPdoped samples resulted in a further drop in resistivity at room temperature (compared to the 950°-1000° C. anneal). The samples were never fully characterized. Annealing has not been conducted above 1200° C. since that is the solidus temperature for the alloys.

During the past ten years, both theoretical and experimental work on the thermal conductivity of SiGe alloys has shown the importance of grain boundary scattering at high temperatures [5, 6]. A grain size of less than 5 um reduced the lattice thermal conductivity by around 35% below the single crystal value of 1000K in heavily-doped alloys [7] but the electrical properties were never measured. Vining [8] at GE Corporation produced GaP-doped fine grain n-type SiGe alloys and did find, as expected, large decreases (up to 30-40%) in the thermal conductivity but, unfortunately, also found an off-setting decrease in the power factor in the same samples, thus resulting in no net gain in the figure of merit Z.

LIST OF CITED REFERENCES

1. B. Abeles, D. S. Beers, G. D. Cody, and J. P. Dismukes, Phys. Rev. 125, 44 (1962).
2. J. P. Dismukes, L. Ekstrom, E. F. Steigmeier, I. Kudman and D. S. Beers, J. Appl. Phys. 35, 2899 (1964).
3. R. K. Pisharody and L. P. Garvey, Proc. 13th Intersociety Energy Conversion Engineering Conf., Publisher: IEEE Publishing Service, N.Y. 1978, 1963.
4. V. Raag (private communication).
5. H. R. Meddins and J. E. Parrott, J. Phys. C: Solid St. Phys. 9, 1263 (1976).
6. N. Savvides and H. J. Goldsmid, J. Phys. C: Solid Phys. 13, 4657 (1980).
7. D. M. Rowe and V. S. Shukula, J. Appl. Phys. 52 (12), 7421 (1981).
8. C. Vining (private communication).
9. C. Wood, D. Zoltan and G. Stapfer, Rev Sci. Instrum. 56, 5 (1985).
10. J. W. Vandersande, C. Wood, A. Zoltan, and D. Whittenberger to be published in the Proceedings of the 19th International Thermal Conductivity Conference, Cookeville, Tenn. (1985).
11. V. M. Glazov and V. S. Zemskov, Physiochemical Foundations of Semiconductor Doping, Nauwa, Moscow (1967).
12. Wm. Yim and F. D.Rosi, Solid-State Elec., 15, 1121 (1972).
13. S. V. Airapetiants, Sov. Phys. Tech. Phys., 2, 429 (1972).

| PAT. NO. | PATENTEE |
| --- | --- |
| 3,600,242 | M. Berkenblit, et al |
| 3,888,701 | K. S. Tarneja, et al |
| 3,935,040 | D. R. Mason |
| 3,984,857 | D. R. Mason |
| 4,120,706 | D. R. Mason |
| 4,154,873 | R. E. Hickox, et al |
| 4,159,214 | D. R. Mason |
| 4,180,825 | D. R. Mason |
| 4,314,595 | K. Yamamoto, et al |
| 4,364,779 | A. Kamgar, et al |
| 4,376,657 | K. Nagasawa, et al |
| 4,397,695 | M. Arlt, et al |
| 4,431,460 | F. Barson, et al |
| 4,437,922 | B. K. Bischoff, et al |
| 4,634,474 | I. Camlibel, et al |
| 4,659,392 | P. K. Vasudev |
| 4,698,486 | R. E. Sheets |

STATEMENT OF THE PRIOR ART

The Mason patents disclose epitaxial growth of GaP on single crystal silicon substrates. In the '040 patent, the device is heated at 900°-1000° C. to diffuse Zn from the GaP layer. In the '214 and '706 patents, the devices are annealed at 1200° C. Camlibel coats a III-V compound with an Si mask and then heat treats at 400° C. for diffusion.

There are numerous patents disclosing stepwise annealing of devices for diverse reasons. Kamgar anneals Si twice at 400° C. in $H_2$ to provide radiation hardening. Arlt anneals an NPN-Si transistor at 510°–590° C. and then at 380°–460° C. to stabilize current gain. Barson heat treats Si twice at about 900° C. after implants of B and As. Hickox anneals Si in air at 600°–950° C. and then at 300°–500° C. Tarneja teaches repeated irradiation and annealing of the surface of a diode to improve forward voltage drop. Nagasawa and Bischoff disclose heat treating a Si wafer from 600° to 1050° C. to decrease defects. Yamamoto heat treats Si in two stages at a 500°–1000° C.

Berkenblit follows low temperature deposition of germanium with a high temperature to change resistivity. Vasudev teaches double epitaxial growth of Si on an insulate followed by heat treatment to amorphize areas of the device.

STATEMENT OF THE INVENTION

It has surprisingly been discovered in accordance with this invention that the thermoelectric properties of Group IV materials doped with III-V compounds are improved about 30% by annealing the materials at a temperature near or above the solidus point and particularly by stepwise heat treatment in stages to a temperature from 50° C. to 150° C. above the solidus point. The solidus point for SiGe alloys containing a minor percent of GaP, the melting temperature is about 1200° C.

SEM and EDX analysis of samples indicates the formation of a Ga-P-Ge rich phase as a result of the annealing above the melting point. It is believed that this phase and increased grain size is associated with the improvement in thermoelectric properties. The grain size grows from a grain size at 1200° C. of about 5 um to a grain size of 50–200 μm.

These and many other features and attendant advantages of the invention will become apparent as the invention becomes better understood by reference to the following detailed description when considered in conjunction with the accompanying drawings.

DETAILED DESCRIPTION OF THE INVENTION

Figure 1:
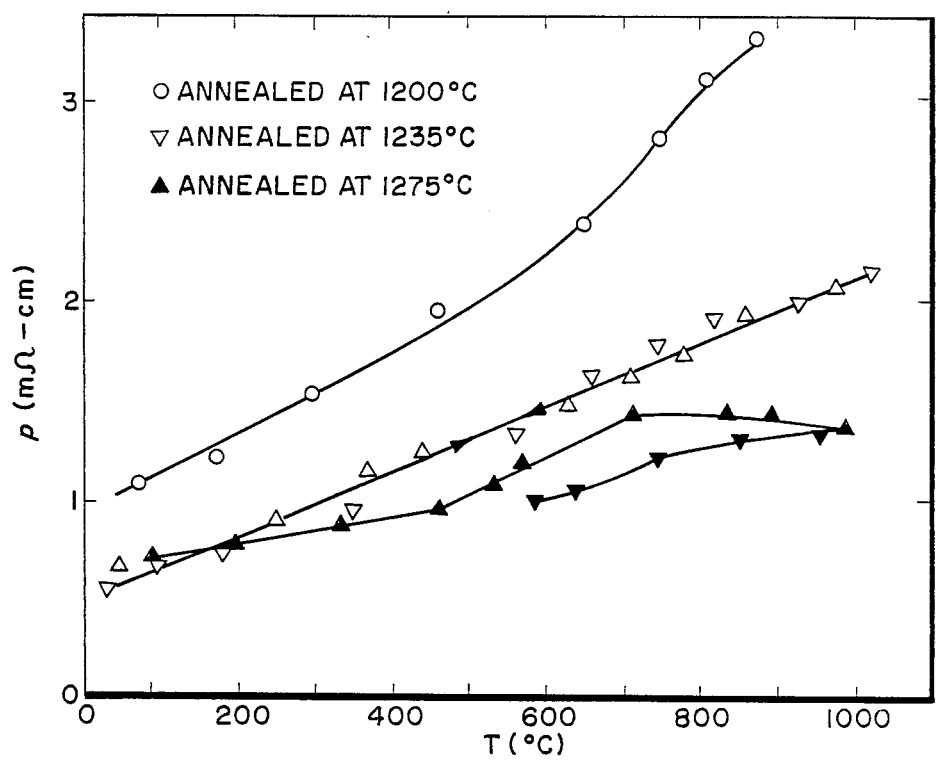
FIG. 1 is a series of curves of the electrical resistivity versus temperature of sample T-106 after having been annealed at 1200° C., 1235° C. and 1275° C.

The thermoelectric element comprises alloys of a mixture of Group IV elements containing from 0.5 to 5 mole percent of a III-V compound. The Group IV material is usually an alloy containing 60–90 atomic percent silicon and 10–40 atomic percent germanium. The III-V compound is usually selected from gallium, indium or aluminum phosphides, antimonides or arsenides or mixtures thereof such as GaP, AlP, GaAs, AlAs, GaAlP, GaAlAs, GaAlP, GaPAs and AlPAs.

The materials most commonly used for thermoelectric devices are SiGe alloys containing a major mole percent of Si doped with 1–3 mole percent of GaP. The commercial form of the thermoelectric material is prepared from powders of Si, Ge and GaP which are twice hot-pressed at a temperature of about 1150° C. into cylindrical form to form a polycrystalline rod.

The hot-pressed material is heat treated in accordance with the invention from 1 to 500 hours, generally from 5 to 200 hours, in an oxygen containing atmosphere such as air. An initial heat treatment is conducted at 1200° C. for about 100 hours to homogenize the sample. The high temperature annealing is preferably conducted in stepwise increments of at least 5° C., generally increments of 10° C. to 50° C. for at least 1 to 10 hours. N-type elements are cut off the cylinder and joined to p-type elements to form a thermoelectric couple device.

EXPERIMENTAL

The SiGe/GaP samples (80 a/o Si-20 a/o Ge with 2 mole percent GaP added) were cylindrical, hot-pressed samples purchased from Thermo-Electron Corporation having a diameter of about ½ inch and a height of about ½ inch. The electrical resistivity, Seebeck coefficient and thermal conductivity were measured from room temperature up to 1000° C. using equipment described elsewhere [9, 10]. The samples were annealed at temperatures between 1100° C. and 1275° C. for from 8 to 100 hours. A white oxide layer (identified as $Ga_2O_3$) and some small surface pitting was observed on the samples which had undergone the higher temperature anneals.

The unetched samples were examined in a SEM using a backscattered electron detector. An x-ray energy dispersive spectrometer was used to measure the compositions semiquantitatively. After the SEM analysis, the samples were etched to reveal the grain structure.

EXAMPLE 1

A hot pressed cylinder (T-106) was heat treated at 1200° C. for 100 hours followed by annealing for 8 hours at 1235° C. and 8 hours at 1275° C.

EXAMPLE 2

A further hot pressed cylinder (T-111) after initial heat treatment at 1200° C. for 100 hours was annealed for 12 hours at 1250° C. and then 12 hours at 1275° C.

EXAMPLE 3

A further hot pressed cylinder was initially heat treated at 1200° C. for 100 hours followed by stepwise annealing as follows:

| Temperature, °C. | Time, Hours |
| --- | --- |
| 1225 | 8 |
| 1235 | 8 |
| 1275 | 8 |

The experiment was conducted three times. The figures of merit (Z) for the three n-type samples were determined to be between 1.0 and $1.1 \times 10^{-3} K^{-1}$ which is an improvement of about 30% over previous materials.

An analysis of the microstructure of the samples using SEM indicated the presence of several new phases. A Ge-Ga-P rich phase was identified in which the atomic concentrations of Ge, Ga and P exceeded the nominal percentage of these atoms in the original alloy. A segregated silicon rich phase was also identified containing particles of SiP and $SiO_2$. The grain size of the material was about 70 $\mu$m. It is believed that the presence of these phases and the large grain size are responsible for the improved thermoelectric properties.

EXPERIMENTAL RESULTS

Property Measurements

Figure 2:
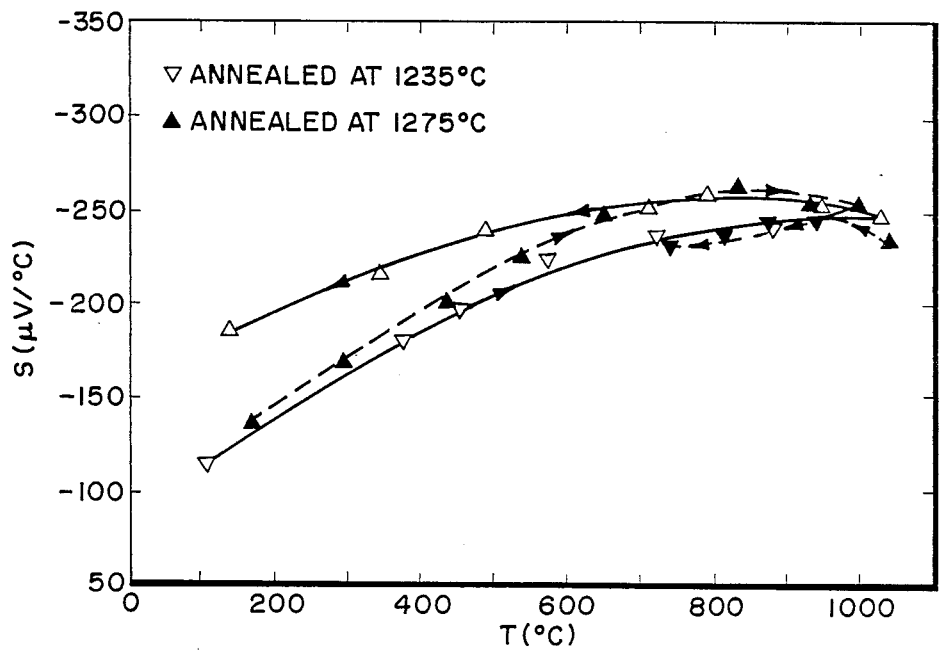
FIG. 2 is the Seebeck Coefficient versus temperature of sample T-106 after having been annealed at 1235° C. and 1275° C.
Figure 3:
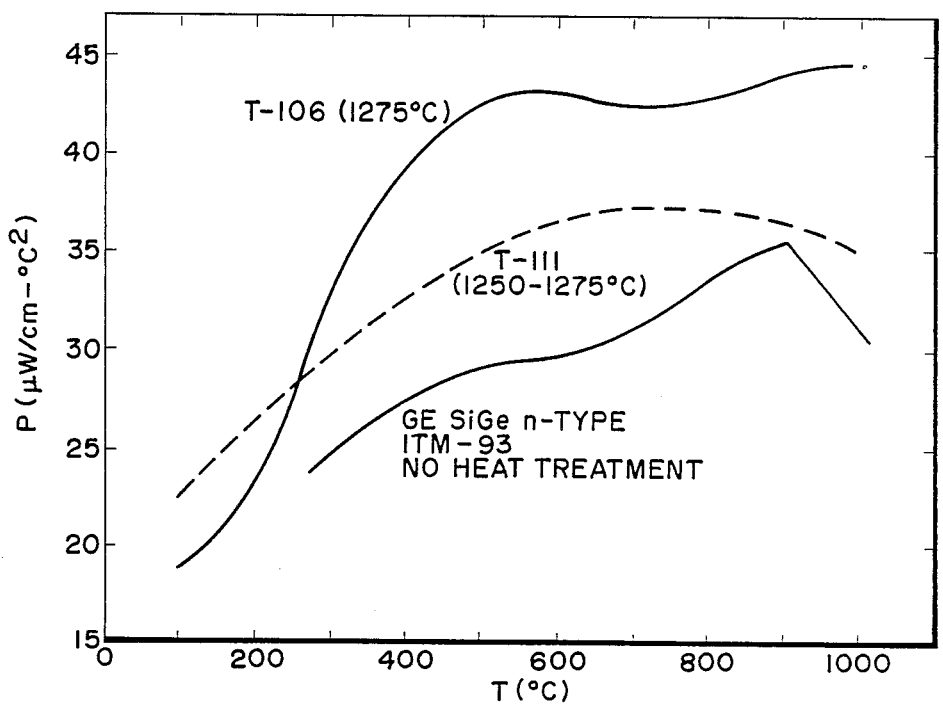
FIG. 3 is a series of curves for the Power factors ($S^2/\rho$) for samples T-106, T-111 and T-118 after their highest temperature anneal. A standard SiGe n-type sample is shown as a comparison.

For all three samples there was a clear drop in resistivity as the sample was annealed at higher temperatures as the three curves for T-106 show in FIG. 1. Conventional theory suggests that the Seebeck coefficient is proportional to the log of the resistivity. Contrary to expectation, the Seebeck coefficients for all three samples hardly changed between the last (highest) temperature anneal and the one previous anneal, as is shown in FIG. 2 for T106. The resultant power factors for all three samples after their highest temperature anneal are shown in FIG. 3. As a comparison, the power factor for a typical production line standard SiGe n-type sample (GE ITM-93) is also given [8]. Since Z depends on $\Lambda$ as well as the power faotor, the question naturally arises regarding the $\Lambda$ of these "improved" samples compared to the standard SiGe samples. Unfortunately the shape of the samples made thermal conductivity measurements (using the flash method [10]) impossible. Two SiGe/GaP rods (T-114 and T-120), which were hot-pressed under the same conditions and annealed at the same temperatures as samples T-106 and T-111 were used instead to cut disks for thermal conductivity measurements. The absolute value of $\Lambda$ for the 1275° C. annealed sample (T114) is approximately no different from that found for zoneleveled and standard n-type SiGe [2]. Using values thus obtained for $\Lambda$ with the power factors for T-106 and T-111 given in FIG. 3 results in Z values very close to $1\times10^{-3}$ K$^{-1}$ (T-111) and just over $1\times10^{-3}$ K$^{-1}$ (T-106) for much of the temperature range: 400–1000° C. These values of Z are significantly higher than those obtained on zone-leveled and standard n-type SiGe.

To reiterate, the improvement in the figure of merit Z is due to an improvement in the power factor and not in the thermal conductivity as was believed by Pisharody et. al. [3]. More specifically, it is the decrease in the resistivity, while the Seebeck coefficient remains essentially unchanged, that has resulted in the higher improved power factor after the high temperature anneal. To understand what caused this unexpected improvement led to the microstructure analysis of the annealed samples.

Microstructure Investigation

The temperature and time of annealing significantly altered the microstructure of the alloys. The grain size, morphology of the matrix and phases present were affected by the annealing schedule. The initial grain size of the material, after a 1165° C. anneal was about 6 $\mu$m. Grain growth did not occur until the annealing temperature was raised above 1200° C. The annealing schedule of T-111, with an anneal at approximately 1225° C. and then at 1250° C., caused the grains to grow to 90 $\mu$m, while the grains in T-106 grew to around 70 $\mu$m after the 1275° C. anneal.

The morphology of the matrix was also altered by the annealing schedule. The microstructure of samples annealed at a low temperature (1165° C.-1200° C.) showed that the silicon particles were not completely diffused into the matrix. Incipient melting had occurred during the annealing resulting in approximately a 5 $\mu$m layer of silicon solid solution (enriched in Ge, Ga, and P) surrounding, or partially surrounding, many grains. Increasing the annealing temperature to approximately 1225° C., enabled the silicon particles to completely diffuse into the matrix. This higher temperature anneal allowed the incipient melted regions also to diffuse into the matrix resulting in a wider, approximately 10 $\mu$m layer, surrounding many grains. This layer had a composition closer to the bulk composition. After being annealed at approximately 1235° C., the morphology of the matrix altered to a random variation in composition, although on a larger scale. This random variation in composition was also the morphology of the matrix in samples T-106 annealed at 1275° C.

Silicon solid solution was the primary phase of all the samples, however, SiO2 was also present as particles, up to 5 $\mu$m in size. SiP and a two phase eutectic possibly SiP and $SiO_2$, were present only in samples T-106 (1275° C. anneal) and T-111 (1250° C. anneal). An unidentified phase is precipitating out of regions of high silicon content. This could also be a silicon solid solution with a higher Ga concentration.

Discussion

The improvement in the power factor for the highest temperature annealed SiGe/GaP sample was unexpected. Changes in the resistivity of SiGe alloys, due to changes in carrier concentration were previously always accompanied by a compensating reduction in $S^2$. This is because both and S are inversely dependent on the carrier concentration, n, as equations 2 and 3 show:

$$\rho - (ne\mu)^{-1} \quad (2)$$

$$S = \frac{k}{3}\left(r + 2 + \frac{\ln Cm*^{3/2}}{n}\right) \quad (3)$$

where e is the electronic charge, $\mu$ the electron mobility, k is the Boltzmann constant, r the scattering factor, m* the effective mass and C a constant.

A change in n, due to precipitation of the donor P, has never, in the past, effected the mobility $\mu$, scattering factor r or the effective mass m*. However, now the various annealing steps have increased the size of the grains and produced the formation of various phases besides changing n. It is thus very possible that one or more of the three parameters u, r or m* has changed due to the altered microstructure resulting in virtually no change in S while $\rho$ decreased. Unfortunately, Hall effect measurements were not possible on T-106 and T-111 because of the shape of the samples. Initial measurements on another n-type Si-Ge-GaP doped sample indicate a moderate increase in mobility and carrier concentration.

It is not too surprising that improvements in Z can be realized by manipulating the doping concentration and microstructure. A maximum in Z occurs for a particular dopant concentration depending on the density of states effective mass. Standard SiGe cannot normally be optimally doped for maximum Z because the limiting solubility of even the highest solubility dopants is too low. Increasing the dopant solubility by some artifice such as partial impurity compensation, as in the case of GaP, (Glazov et al. [11]) will raise the carrier concentration (n) and, hence, lower the resistivity. This, in turn will tend to maximize the power factor of SiGe.

Improvements in $S^2/\rho$ may also be brought about by changes in the scattering factor (r). For example, for ionized impurity scattering: $r=2$, which would appreciably increase the Seebeck coefficient above that for acousticmode lattice scattering, $r=0$. This may more than offset the fall in electrical conductivity due to additional impurity scattering. Ionized impurity scattering may be induced by increased solubility of impurities.

Increased $S^2/\rho$ values may also be realized by increasing the charge carrier mobility. Since there is considerable grain growth of the SiGe alloys after annealing, the mobility will increase due to the reduction in grain boundary scattering.

The theoretical dependencies of S and $\rho$ on n would suggest that raising one should raise the other. This is not always the case for SiGe alloys as reported here. The results indicate that, after the highest temperature annealing of GaP-doped $Si_{80}Ge_{20}$, the material is quite inhomogeneous and, although the annealing raises the total thermal conductivity to that of standard $Si_{80}Ge_{20}$, the electronic component of the thermal conductivity has also increased due to an increase in electrical conductivity. Thus, by subtraction, the lattice component of the thermal conductivity must be appreciably lower than that of the standard material.

In summary, there are several reasons which could account for the improvement in Z of annealed GaP-doped $Si_{80}Ge_{20}$: optimization of the free charge carrier concentration due to enhanced dopant solubility; increased charge carrier mobility by grain growth; an improved power factor resulting from enhanced impurity scattering, by which the Seebeck coefficient is improved by a larger margin than the charge carrier mobility is reduced; an increased power factor and a decreased thermal conductivity due to a reduction in circulating currents; and a reduced lattice thermal conductivity due to enhanced phonon scattering by inhomogeneities.

It is to be realized that only preferred embodiments of the invention have been described and that numerous substitutions, modifications and alterations are permissible without departing from the spirit and scope of the invention as defined in the following claims.

We claim:

1. A method of producing an improved thermoelectric element comprising the steps of:
    annealing an alloy of a Group IV material and a Group III-V compound at a temperature close to or above the solidus point.

2. A method according to claim 1 in which the alloy contains from 0.1 to 10 mole percent mixture of Group III-V elements or compounds.

3. A method according to claim 2 in which the Group III metal is selected from at least one of gallium, indium or aluminum and the Group V element is selected from at least one of phosphorous, antimony or arsenic.

4. A method according to claim 3 in which the compound is gallium phosphide.

5. A method according to claim 4 in which the Group IV material is a mixture containing 60 to 90 atomic percent silicon and 10 to 40 atomic percent germanium.

6. A method according to claim 5 in which the annealing is conducted at a temperature above 1200° C. for a period sufficient to increase the grain size to above 50 um.

7. A method according to claim 6 in which the annealing is conducted in air for a period of at least 1 hour.

8. A method according to claim 7 in which the annealing is conducted at a high, single temperature at least 50° C. above the solidus temperature or stepwise at increasingly higher temperatures above the solidus temperature in increments of at least 5° C.

9. A method according to claim 8 in which the annealing is conducted at temperatures from 1200° C. to 1350° C.

10. A method according to claim 9 in which the annealing is conducted in a single increment or in increments of at least 10° C. for intervals of 5 to 15 hours at temperatures from 1200° C. to 1275° C.

* * * * *